United States Patent [19]

Shimada et al.

[11] Patent Number: 5,471,070
[45] Date of Patent: Nov. 28, 1995

[54] THIN-FILM TRANSISTOR CIRCUIT HAVING AN AMORPHOUS SILICON LOAD AND A DRIVER TRANSISTOR AND A METHOD OF PRODUCING THE SAME

[75] Inventors: Yoshinori Shimada, Yamatokoriyama; Naofumi Kondo, Nara; Takehisa Sakurai, Kusatsu; Yoshiharu Kataoka, Suita; Manabu Takahama, Tenri; Mikio Katayama, Ikomo, all of Japan

[73] Assignee: Sharp Kabushiki Kaisha, Osaka, Japan

[21] Appl. No.: 387,361

[22] Filed: Feb. 13, 1995

Related U.S. Application Data

[63] Continuation of Ser. No. 142,238, Oct. 25, 1993, abandoned.

[30] Foreign Application Priority Data

Oct. 30, 1992 [JP] Japan .................................... 4-293526

[51] Int. Cl.[6] ........................... H01L 27/02; H01L 29/78
[52] U.S. Cl. ............................... 257/57; 257/379; 257/537
[58] Field of Search .................. 257/57, 59, 61, 257/52, 379, 537, 536; 307/445; 359/59

[56] References Cited

U.S. PATENT DOCUMENTS

| 4,618,873 | 10/1986 | Sasano et al. | 257/52 |
| 4,752,814 | 6/1988 | Tuan | 257/61 |

FOREIGN PATENT DOCUMENTS

| 170813 | 10/1991 | China . | |
| 60-182168 | 9/1985 | Japan . | |
| 60-182169 | 9/1985 | Japan | 257/57 |
| 61-13665 | 1/1986 | Japan . | |
| 61-234623 | 10/1986 | Japan | 307/445 |
| 62-40823 | 2/1987 | Japan | 307/445 |
| 1-287958 | 11/1989 | Japan | 257/904 |
| 3-217053 | 9/1991 | Japan . | |
| 4-100270 | 4/1992 | Japan | 257/57 |
| 4-207416 | 7/1992 | Japan | 307/445 |
| 1411934 | 7/1988 | U.S.S.R. | 307/445 |
| 9111027 | 7/1991 | WIPO | 257/52 |

OTHER PUBLICATIONS

A. Yoshida et al., Extended Abstracts of the 22nd (1990 International) Conference on Solid State Devices and Materials, pp. 1197–1198, Aug. 22–24, 1990.

P. K. Weimer et al., "Proceedings of the IEEE", vol. 54, No. 3, pp. 354–360, Mar., 1966.

*Primary Examiner*—Jerome Jackson
*Assistant Examiner*—John Guay
*Attorney, Agent, or Firm*—David G. Conlin; Kevin J. Fournier

[57] ABSTRACT

A thin-film transistor circuit for a logic gate circuit includes: an amorphous silicon layer; a driver transistor having a source region, a drain region, and a channel region, the source, drain, and channel regions being formed in the amorphous silicon layer; and a load device formed in the amorphous silicon layer and made of $n^-$ amorphous silicon, the load device being connected to the driver transistor.

10 Claims, 5 Drawing Sheets

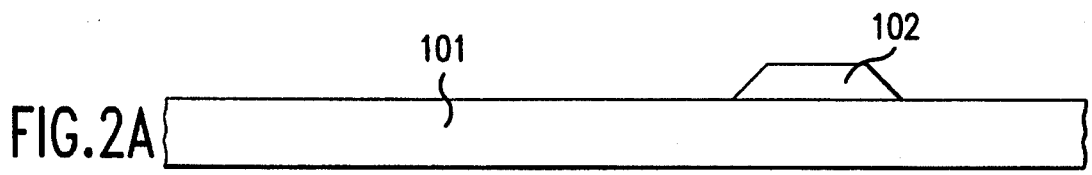
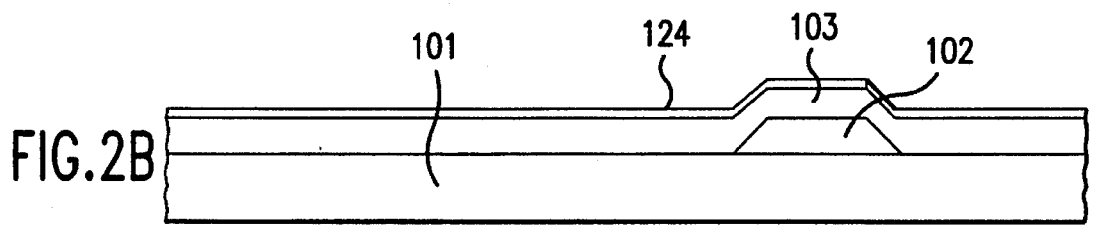
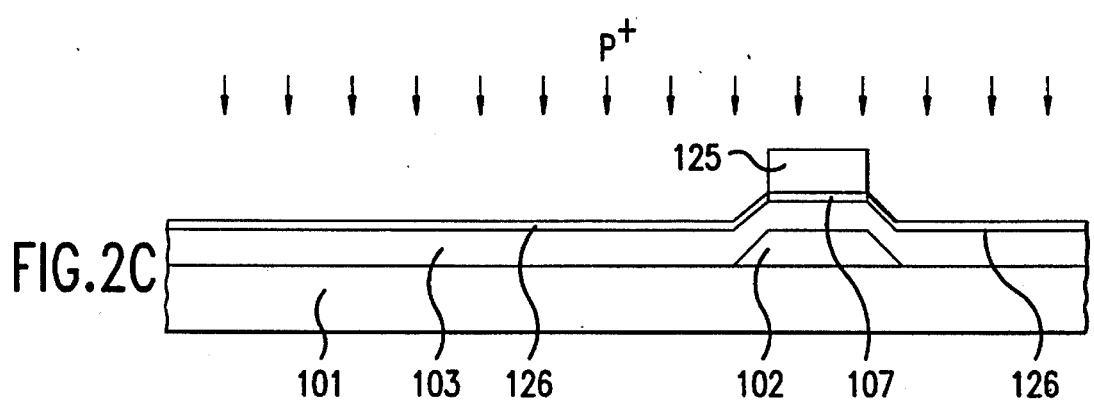
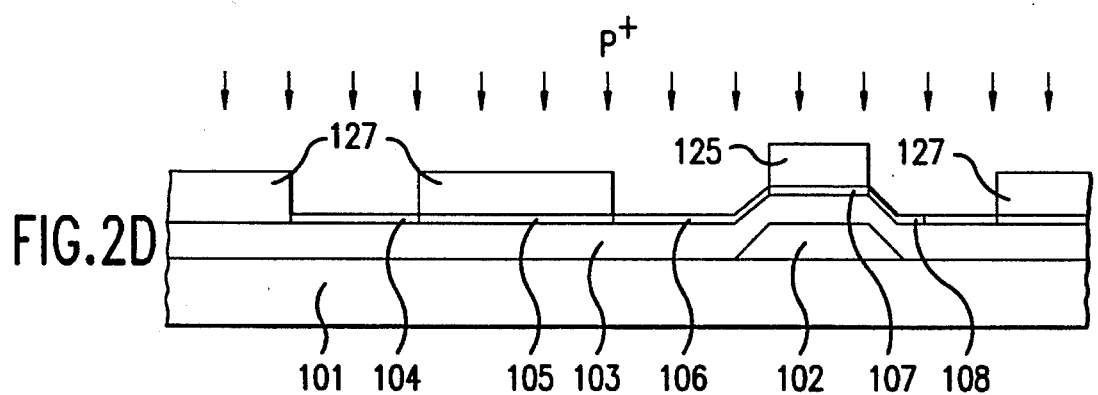
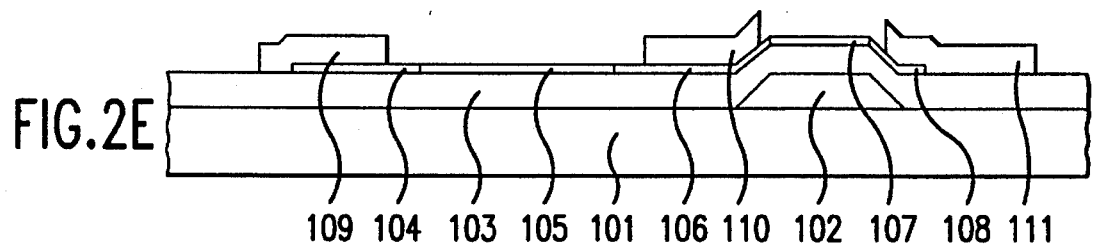

5,471,070

THIN-FILM TRANSISTOR CIRCUIT HAVING AN AMORPHOUS SILICON LOAD AND A DRIVER TRANSISTOR AND A METHOD OF PRODUCING THE SAME

This is a continuation of application Ser. No. 08/142,238, filed Oct. 25, 1993, now abandoned.

BACKGROUND OF THE INVENTION

1. Field of the Invention

The present invention relates to a thin-film transistor circuit utilized as a driver circuit for a liquid crystal display apparatus or for an imaging sensor, and particularly, to a thin-film transistor circuit suitable for a driver-monolithic active matrix type liquid crystal display apparatus.

2. Description of the Related Art

A logic gate circuit, such as NOT, NOR, NAND, etc., consisting of thin-film transistors is conventionally used as a driver for a liquid crystal display apparatus. FIG. 5A is a schematic plan view illustrating a conventional thin-film transistor circuit 530. FIG. 5B is a schematic cross sectional view of the thin-film transistor circuit 530 taken along a line A–A' in FIG. 5A of the thin-film transistor circuit 530. The thin-film transistor circuit 530 is a NOT-type logic gate circuit.

The thin-film transistor circuit 530 has a load transistor 521 formed on an insulating substrate 501 and a driver transistor 522 formed on the insulating substrate 501. The load transistor 521 consists of a gate electrode 502 formed on the insulating substrate 501, a gate insulating film 504 formed on the insulating substrate 501 and the gate electrode 502, a channel region 505 formed on the gate insulating film 504, a source region 507 formed on the gate insulating film 504, and a drain region 508 formed on the gate insulating film 504. The channel region 505 is made of intrinsic amorphous silicon. The source region 507 and the drain region 508 are made of highly doped n-type ($n^+$) amorphous silicon. The driver transistor 522 consists of a gate electrode 503 formed on the insulating substrate 501, the gate insulating film 504 formed on the insulating substrate 501 and the gate electrode 503, a channel region 506 formed on the gate insulating film 504, a source region 509 formed on the gate insulating film 504, and a drain region 510 formed on the gate insulating film 504. The channel region 506 is made of intrinsic amorphous silicon. The source region 509 and the drain region 510 are made of $n^+$ amorphous silicon.

The gate electrode 502 of the load transistor 521 is electrically connected to a supply line 511 through a contact hole 512 formed in the gate insulating film 504. The source region 507 of the load transistor 521 is electrically connected to the supply line 511. Both the drain region 508 of the load transistor 521 and the source region 509 of the driver transistor 522 are electrically connected to an output line 513. The drain region 510 of the driver transistor 522 is electrically connected with a ground line 514.

Because the gate electrode 502 is electrically connected to the source region 507, the load transistor 521 is in an on state at any time and functions as a resistor. In the thin-film transistor circuit 530, when a low-level voltage is applied to the gate electrode 503 of the driver transistor 522, the driver transistor 522 turns off. A current, then, flows from the supply line 511 to the output line 513 via the load transistor 521. When a high-level voltage is applied to the gate electrode 503, the driver transistor 522 turns on. Then, a current flows from the supply line 511 to the ground line 514, and the output line 513 has the same voltage as the voltage of the ground line 514. Thus, the output line 513 can output a high-level voltage during the off state of the driver transistor 522 and a low-level voltage during the on state of the driver transistor 522 by adjusting the resistance of the load transistor 521.

In the aforementioned conventional thin-film transistor circuit 530, the load transistor 521 serves as a resistor device. In order to make the thin-film transistor circuit 530 work as a logic gate circuit, the current gain of the driver transistor 522 must be fifty times larger than that of the load transistor 521. Since thin-film transistors made of amorphous silicon generally have a small current gain, the driver transistor 522 must have a large channel region 506 so that the current gain of the driver transistor 522 is sufficiently large. Therefore, the driver transistor 522 must have a large area, which prevents the thin-film transistor circuit 530 from being made small. Other logic gate circuits than the NOT-type logic gate circuit may also have the same problems as mentioned above.

The present invention overcomes the aforementioned shortcomings associated with the conventional technique and provides a thin-film transistor circuit having a small area and good device characteristics.

SUMMARY OF THE INVENTION

The thin-film transistor circuit of this invention, includes: an amorphous silicon layer; a driver transistor having a source region, a drain region, and a channel region, the source, drain, and channel regions being formed in the amorphous silicon layer; and a load device formed in the amorphous silicon layer and made of $n^-$ amorphous silicon, the load device being connected to the driver transistor.

According to another aspect of the invention, a thin-film transistor circuit is provided. The thin-film transistor circuit includes: an amorphous silicon layer; a load device formed in the amorphous silicon layer and made of $n^-$ amorphous silicon; a supply line electrically connected to the load device, for applying a supply voltage to the load device; an output line electrically connected to the supply line through the load device, for outputting logic level voltages; a first driver transistor having a gate electrode, a source region, a drain region, and a channel region, the source, drain, and channel regions being formed in the amorphous silicon layer, for being switched based on a voltage applied to the gate electrode; and a ground line electrically connected to the output line through the first driver transistor, for applying a ground voltage to the first driver transistor.

In one embodiment of the invention, a thin-film transistor circuit further includes: a second driver transistor having a gate electrode, a source region, a drain region, and a channel region, the source, drain, and channel regions being formed in the amorphous silicon layer, the second driver transistor being connected to the first driver transistor in parallel, and the output line being connected to the ground line through the first and second driver transistors.

In another embodiment of the invention, a thin-film transistor further includes: a second driver transistor having a gate electrode, a source region, a drain region, and a channel region, the source, drain, and channel regions being formed in the amorphous silicon layer, the second driver transistor being connected to the first driver transistor in series, and the output line being connected to the ground line through the first and second driver transistors.

According to still another aspect of the invention, a method for producing a thin-film transistor circuit is provided. The method includes the steps of: forming an amorphous silicon layer on an insulator; forming a first resist pattern on the amorphous silicon layer; implanting an n-type impurity into the amorphous silicon layer using the first resist pattern as a mask so as to form at least a load device made of $n^-$ amorphous silicon in the amorphous silicon layer; forming a second resist pattern on the amorphous silicon layer; and implanting an n-type impurity into the amorphous silicon layer using the first and second resist patterns as a mask so as to form an $n^+$ region in the amorphous silicon layer.

In one embodiment of the invention, both of the implanting steps are performed by an ion shower doping method.

According to the thin-film transistor circuit of the present invention, a load device consists of $n^-$ amorphous silicon having a high resistance.

Thus, the invention described herein makes possible the advantage of providing a thin-film transistor circuit which has a small area and is driven with a low operating current.

This and other advantages of the present invention will become apparent to those skilled in the art upon reading and understanding the following detailed description with reference to the accompanying figures.

BRIEF DESCRIPTION OF THE DRAWINGS

FIGS. 2A to 2E illustrate a method for producing a thin-film transistor circuit as shown in FIG. 1.

DESCRIPTION OF THE PREFERRED EMBODIMENTS

EXAMPLE 1

Figure 1:
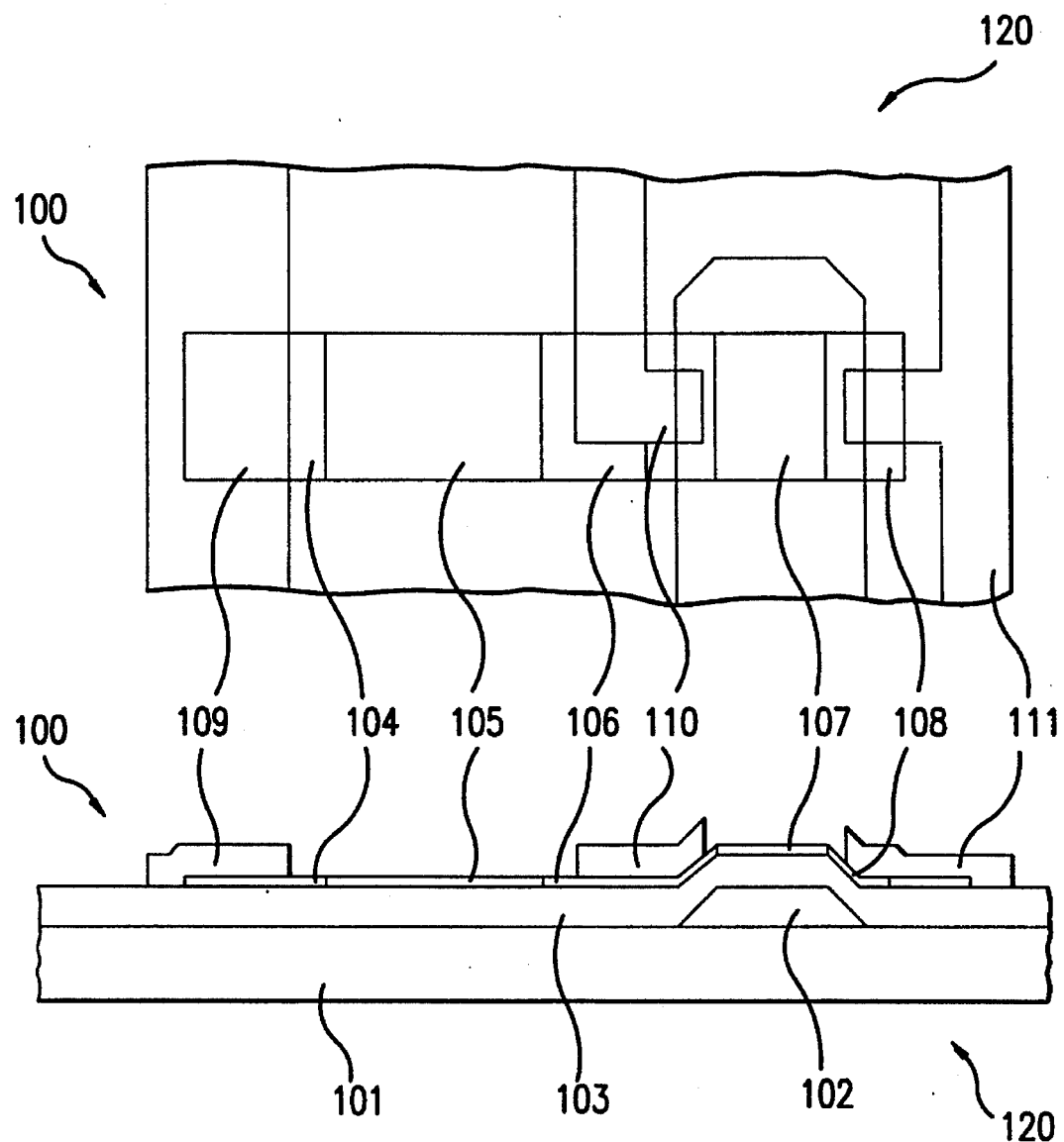
FIG. 1 is a schematic plan view and a cross sectional view of a thin-film transistor circuit for a NOT-type logic gate of the present invention.

FIG. 1 schematically shows a plan view and a cross sectional view of a thin-film transistor circuit 100 of the present invention. The thin-film transistor circuit 100 is a NOT-type logic gate circuit.

The thin-film transistor circuit 100 has a load device 105 and a driver transistor 120, both formed on an insulating substrate 101. The driver transistor 120 consists of a gate electrode 102 formed on the insulating substrate 101, a gate insulating film 103 formed on the gate electrode 102 and the insulating substrate 101, a channel region 107 formed on the gate insulating film 103, arid $n^+$ regions 106 and 108 both formed on the gate insulating film 103. The channel region 107 is made of intrinsic amorphous silicon, and the $n^+$ regions 106 and 108 are made of $n^+$ amorphous silicon. The $n^+$ regions 106 and 108 function as a source region and a drain region of the driver transistor 120, respectively. The $n^+$ regions 106 and 108 are electrically connected to an output line 110 and a ground line 111, respectively.

The load device 105 is formed adjacently to the $n^+$ region 106. The load device 105 is made of $n^-$ amorphous silicon which is lightly doped with n-type impurity. The load device 105 is electrically connected to a supply line 109 through an $n^+$ silicon region 104.

Referring to FIG. 1, operation of the thin-film transistor circuit 100 is now explained. When a low-level voltage is applied to the gate electrode 102, the driver transistor 120 turns off. A resistance between the $n^+$ regions 106 and 108 becomes much higher than that of the load device 105. Since the supply line 109 supplies a high-level voltage, a current flows from the supply line 109 to the output line 110 via the load device 105. The output line outputs a high-level voltage. When a high-level voltage is applied to the gate electrode 102, the driver transistor 120 turns on. The resistance between the $n^+$ regions 106 and 108 becomes sufficiently lower than that of the load device 105. Then, a current flows from the supply line 109 to the ground line 111, and the potential of the output line 110 becomes a ground level. Thus, the output line 110 outputs a low-level voltage.

Referring to FIGS. 2A to 2E, a method for producing a thin-film transistor circuit 100 of the present invention is now explained.

As is shown in FIG. 2A, a tantalum film (not shown) having a thickness of 300 nm is formed on an insulating substrate 101 by a sputtering method. The tantalum film is etched using a resist pattern (not shown) and a gate electrode 102 is formed on the insulating substrate 101. The insulating substrate 101 is preferably made of a clear material, such as glass.

As is shown in FIG. 2B, a gate insulating film 103 is formed on the gate electrode 102 and the insulating substrate 101 by a CVD (chemical vapor deposition) method. The gate insulating film 103 has a thickness of 300 nm, and is made of silicon nitride. An intrinsic amorphous silicon layer 124 is successively formed on the gate insulating film 103 by a CVD method. The intrinsic amorphous silicon layer 124 has a thickness of 30 nm. After coating a photoresist (not shown) over an entire upper surface of the insulating substrate 101, the photoresist is exposed with the gate electrode 102 as a mask by radiating light from the back side of the insulating substrate 101. As is shown in FIG. 2C, by developing the exposed photoresist, a resist pattern 125 is formed on the intrinsic amorphous silicon layer 124. The resist pattern 125 has substantially the same pattern as that of the gate electrode 102.

Phosphorus ion, as an n-type impurity, is implanted into the intrinsic amorphous silicon layer 124 using the resist pattern 125 as a mask. It is preferable to utilize an ion shower doping method, for example, a method described in Akihisa Yoshida et al., "Fabrication of a-Si:H TFT's by a Large Area Ion Doping Technique", Extended Abstracts of the 1990 International Conference on Solid State Devices and Materials, Sendai, 1990, pp 1197–1198, so that the n-type impurity is implanted uniformly into a large area of the intrinsic amorphous silicon layer 124. Because the resist pattern 125 is formed using the gate electrode 102 as a mask, an $n^-$ region 126 is formed in self-alignment with the gate electrode 102. The $n^-$ region 126 preferably has a high resistance, specifically, has a sheet resistance in the range of $10^7$ ohm per square to $10^{10}$ ohm per square. In the case where the driver transistor has a resistance of $1.0^6$ ohm in an on state and a resistance of $10^{12}$ ohm in an off state, the $n^-$ region 126 more preferably has a sheet resistance in the range of $10^8$ ohm per square to $10^9$ ohm per square. In order to obtain such a high sheet resistance, phosphorus ion is implanted with a dose of about $10^{13}$ cm$^{-2}$. The resist pattern 125 covers a part of the intrinsic amorphous silicon layer 124, which is not doped with phosphorus ion and becomes a channel region 107 consisting of intrinsic amorphous silicon.

As is shown in FIGS. 2C and 2D, a resist pattern 127, then, is formed on the n$^-$region 126 without removing the resist pattern 125. Phosphorus ion is implanted into the n$^-$region 126 using the resist patterns 125 and 127 as a mask with a dose of about $10^{15}$ cm$^{-2}$. This ion implantation is also preferably performed by the ion shower doping method. After ion implantation, n$^+$ regions 106 and 108 are formed on the gate insulating film 103 in self-alignment with the gate electrode 102. An n$^+$ region 104 is simultaneously formed on the gate insulating film 103. The portion covered with the resist pattern 127 becomes a load device 105 made of n$^-$amorphous silicon.

After removing the resist patterns 125 and 127, as is shown in FIG. 2E, the amorphous silicon semiconductor layer is patterned so that unnecessary portions are removed. A titanium film (not shown) having a thickness of 300 nm is deposited over the entire surface. Then, a supply line 109, an output line 110, and a ground line 111 are formed on a part of the n$^+$ regions 104, 106, and 108 by patterning the titanium film.

As is explained above, in the thin-film transistor circuit 100 of the present invention, an n$^-$region is formed as a load device 105 adjacently to a driver transistor 120. The n$^-$ region can be formed in intrinsic amorphous silicon layer by an ion shower doping method such that the n$^-$region has a high sheet resistance. Therefore, the load device 105 of the present invention can have a small area, compared to a conventional load device consisting of a thin-film transistor. For example, the thin-film transistor circuit 100 has an area of 50 μm×100 μm, which is one-third that of a conventional thin-film transistor circuit. The load device 105 having a high resistance can also reduce an operating current of the thin-film transistor circuit of the present invention. These advantages can make the integration of a thin-film transistor circuit of the present invention more densely.

Moreover, because a source region and a drain region are formed in self-alignment with a gate electrode, a gate-source capacitance and a gate-drain capacitance can be reduced. Therefore, the thin-film transistor circuit has good device characteristics. The thin-film transistor circuit of the present invention can be made by the same manufacturing process as that used for producing driver transistors for an active matrix-type liquid crystal display apparatus. Therefore, it is appreciated that the present invention can be applied to a driver-monolithic active matrix type liquid crystal display apparatus.

EXAMPLE 2

Figure 3:
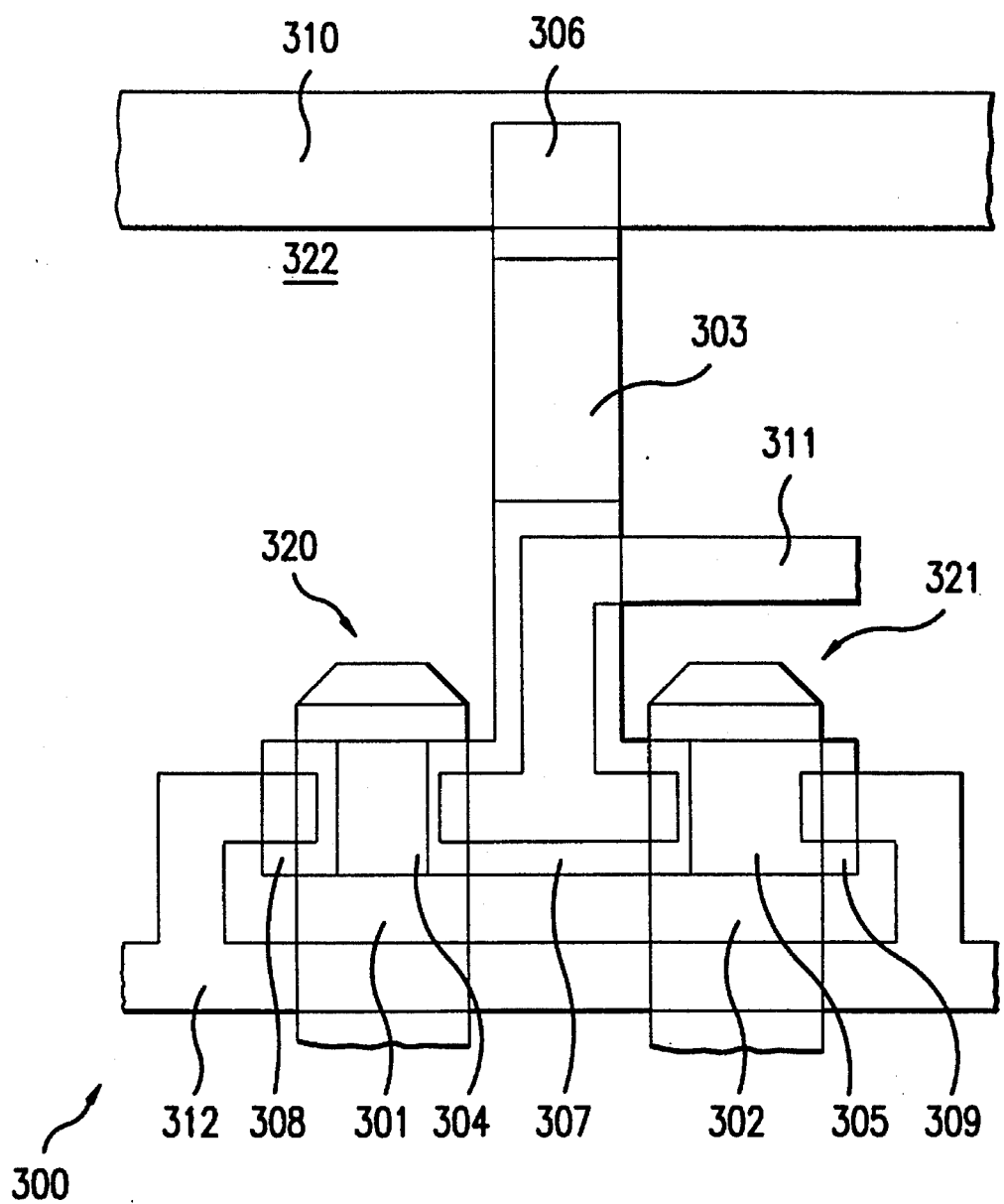
FIG. 3 is a schematic plan view of a thin-film transistor circuit for a NOR-type logic gate of the present invention.

FIG. 3 shows a schematic plan view of a thin-film transistor circuit 300 of the present invention. The thin-film transistor circuit 300 is a NOR-type logic gate circuit.

The thin-film transistor circuit 300 has a load device 303 and driver transistors 320 and 321. The driver transistor 320 has a gate electrode 301 formed on a substrate 322, a channel region 304 formed on a gate insulating film (not shown), and n$^+$ regions 307 and 308 both formed on the gate insulating film. The driver transistor 321 has a gate electrode 302 formed on the substrate 322, a channel region 305 formed on the gate insulating film (not shown), and the n$^+$ region 307 and an n$^+$ region 309 both formed on the gate insulating film. The channel regions 304 and 305 are made of intrinsic amorphous silicon. The n$^+$ region 307 functions as a source region for both the driver transistors 320 and 321. The n$^+$ regions 308 and 309 function as drain regions for the driver transistors 320 and 321, respectively. The n$^+$ region 307 is electrically connected to an output line 311. Both the n$^{+0}$ regions 308 and 309 are electrically connected to a ground line 312. Thus, the driver transistors 320 and 321 are electrically connected in parallel between the output line 311 and the ground line 312.

The load device 303 is formed adjacently to the n$^+$ region 307 and made of n$^-$ amorphous silicon. The load device 303 is electrically connected to a supply line 310 though an n$^+$ region 306.

Referring to FIG. 3, operation of the thin-film transistor circuit 300 is now explained. When a low-level voltage is supplied to both the gate electrodes 301 and 302, both the driver transistors 320 and 321 turn off. Both a resistance between the n$^+$ regions 307 and 308 and a resistance between the n$^+$ regions 307 and 309 become much higher than that of the load device 303. Since the supply line 310 applies a high-level voltage to the load device 303, a current flows from the supply line 310 to the output line 311 via the load device 303. The output line 311 outputs a high-level voltage. When a high-level voltage is supplied to at least one of the gate electrodes 301 and 302, at least one of the driver transistors 320 and 321 turns on. At least one of the resistances between the n$^+$ regions 307 and 308 and between the n$^+$ regions 307 and 309 is sufficiently lower than that of the load device 303. Thus, a current flows from the supply line 310 to the ground line 312, and the potential of the output line 311 becomes a ground level. Thus, the output line 311 outputs a low-level voltage.

The thin-film transistor circuit 300 is produced by the same method as that for producing the thin-film transistor circuit 100 in Example 1. As explained in Example 1, the load device 303 made of the n$^-$ amorphous silicon is formed by implanting an n-type impurity into the intrinsic amorphous silicon layer formed on the gate insulating film. The channel region 304 and the n$^+$ regions 307 and 308 of the driver transistor 320, and the channel region 305 and the n$^+$ regions 307 and 309 of the driver transistor 321 are also formed in the intrinsic amorphous silicon layer.

EXAMPLE 3

Figure 4:
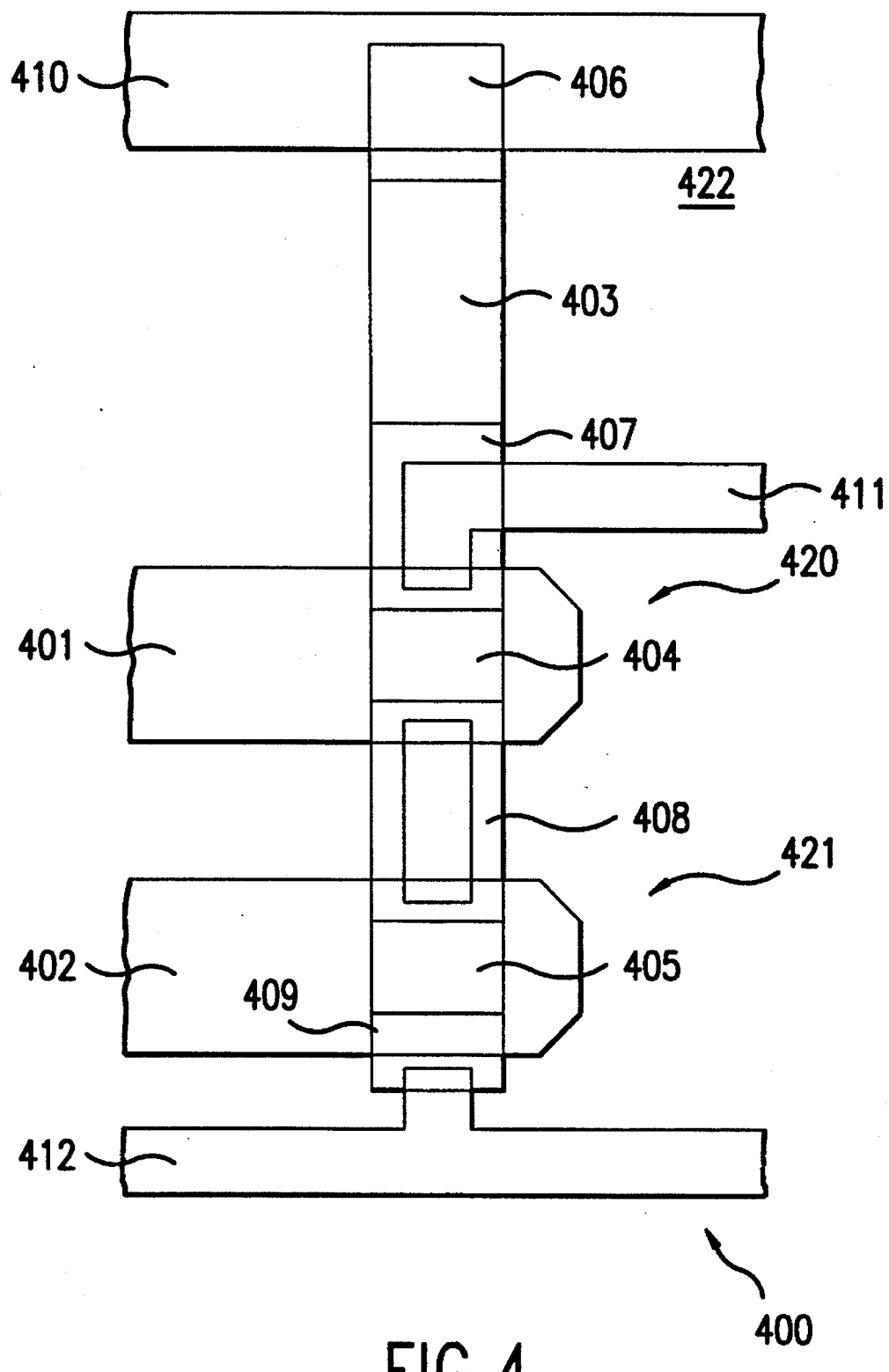
FIG. 4 is a schematic plan view of a thin-film transistor circuit for a NAND-type logic gate of the present invention.
Figure 5A:
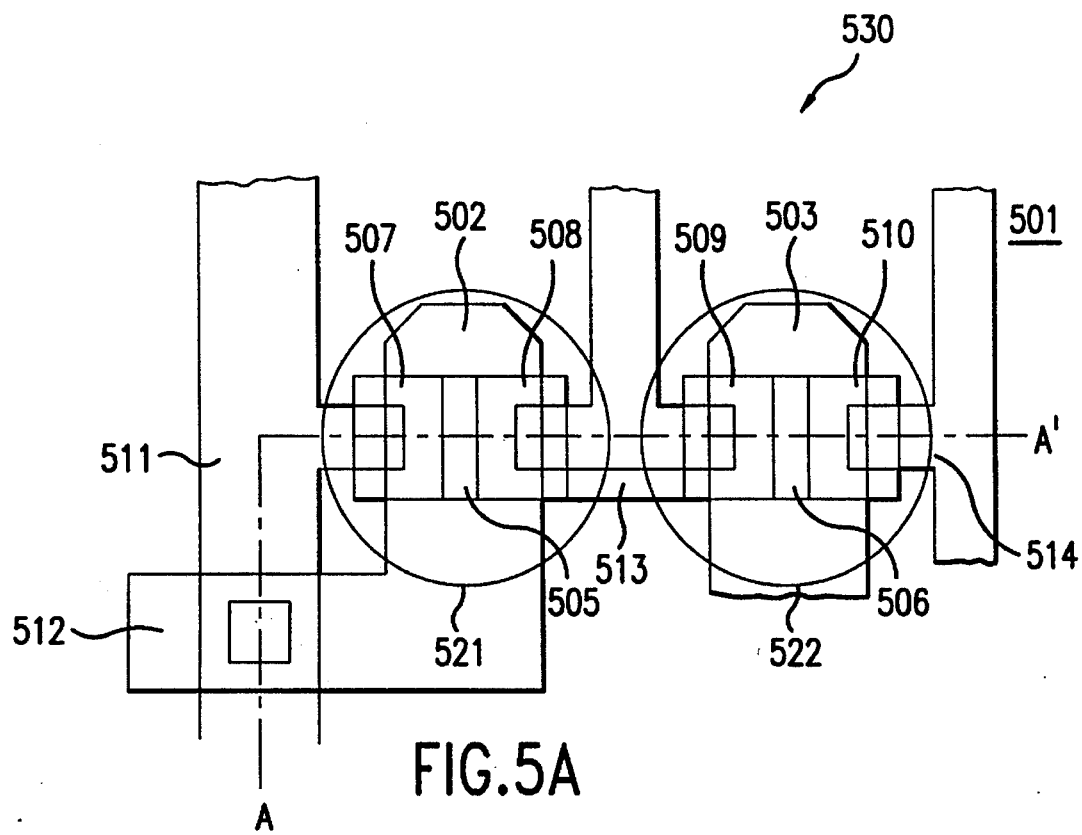
FIG. 5A is a schematic plan view of a thin-film transistor circuit for a NOT-type logic gate according to a conventional technique.
Figure 5B:
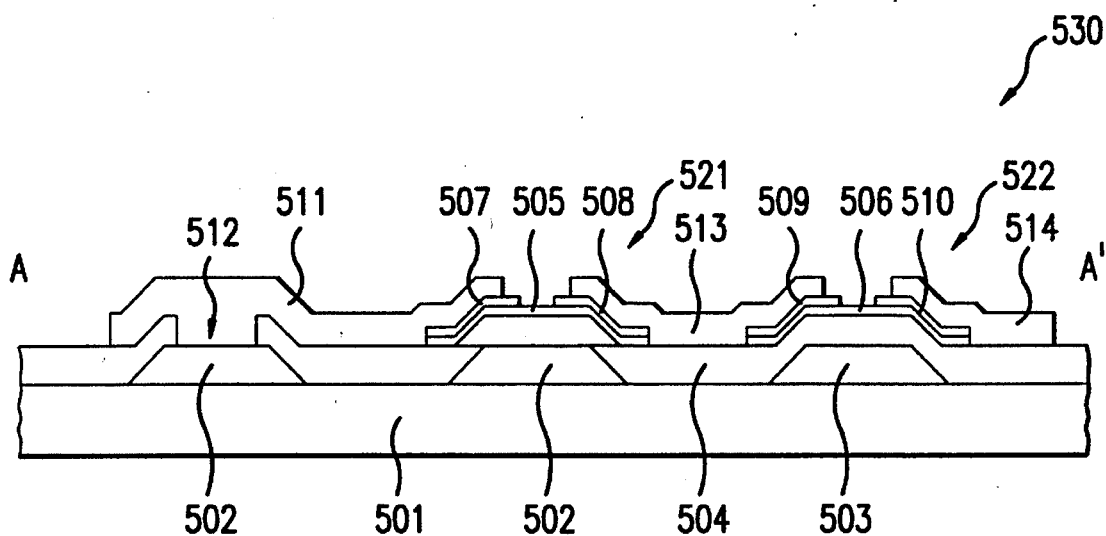
FIG. 5B is a schematic cross sectional view taken along a line A–A' of FIG. 5A of the thin-film transistor circuit.

FIG. 4 shows a schematic plan view of a thin-film transistor circuit 400 of the present invention. The thin-film transistor circuit 400 is a NAND-type logic gate circuit.

The thin-film transistor circuit 400 has a load device 403 and driver transistors 420 and 421. The driver transistor 420 has a gate electrode 401 formed on a substrate 422, a channel region 404 formed on a gate insulating film (not shown), and n$^+$ regions 407 and 408 both formed on the gate insulating film. The driver transistor 421 has a gate electrode 402 formed on the substrate 422, a channel region 405 formed on the gate insulating film (not shown), and the n$^+$ region 408 and an n$^+$ region 409 both formed on the gate insulating film. The channel regions 404 and 405 are made of intrinsic amorphous silicon. The n$^+$ region 407 functions as a source region for the driver transistor 420. The n$^+$ region 408 functions as a drain region for the driver transistor 420 and as a source region for the driver transistor 421. The n$^+$ region 409 functions as a drain region for the driver transistors 421. The n$^+$ region 407 is electrically connected to an output line 411. The n$^+$ region 409 is electrically connected to a ground line 412. Thus, the driver transistors 420 and 421 are electrically connected in series between the output line 411 and the ground line 412.

The load device 403 is formed adjacently to the $n^+$ region 407 and made of $n^-$ amorphous silicon. The load device 403 is electrically connected to a supply line 410 though an $n^+$ region 406.

Referring to FIG. 4, operation of the thin-film transistor circuit 400 is now explained. When a low-level voltage is supplied to at least one of the gate electrodes 401 and 402, at least one of the driver transistors 420 and 421 turns off. The resistance between the $n^+$ regions 407 and 409 becomes much higher than that of the load device 403. Since the supply line 410 supplies a high-level voltage to the load device 403, a current flows from the supply line 410 to the output line 411 via the load device 403. The output line 411 outputs a high-level voltage. When a high-level voltage is supplied to both the gate electrodes 401 and 402, both the driver transistors 420 and 421 turn on. The resistance between the $n^+$ regions 407 and 409 is sufficiently lower than that of the load device 403. A current flows from the supply line 410 to the ground line 412, and the potential of the output line 411 becomes a ground level. Thus, the output line 411 outputs a low-level voltage.

The thin-film transistor circuit 400 is produced by the same method as that for producing the thin-film transistor circuit 100 in Example 1. As explained in Example 1, the load device 403 made of the $n^-$ amorphous silicon is formed by implanting an n-type impurity into the intrinsic amorphous silicon layer formed on the gate insulating film. The channel region 404 and the $n^+$ regions 407 and 408 of the driver transistor 420, and the channel region 405 and the $n^+$ regions 407 and 409 of the driver transistor 421 are also formed in the intrinsic amorphous silicon layer.

As is explained in examples 1, 2, and 3, the thin-film transistor circuit of the present invention can have a smaller circuit area and better device characteristics than those made from a conventional technique. The thin-film transistor circuit of the present invention can be suitably included in a liquid crystal display apparatus as a driver circuit, and can improve display quality of the liquid crystal display apparatus.

Some exemplary value for impurity concentrations and other dimensions are mentioned above. It will be appreciated that other values which will enable operation of the invention described also may be used.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A thin-film transistor circuit for a logic gate circuit, comprising:

a continuous amorphous silicon layer substantially having a uniform thickness;

a driver transistor having a source region, a drain region, a channel region, and a gate electrode, said source, drain, and channel regions being formed in said continuous amorphous silicon layer; and a load device formed in said continuous amorphous silicon layer and made of $n^-$ amorphous silicon, said load device being directly connected to said source region of said driver transistor, wherein said $n^-$ amorphous silicon is doped with an $n^-$ type impurity at a lower concentration than that of said source and drain regions.

2. A thin-film transistor circuit for a logic gate circuit, comprising:

a continuous amorphous silicon layer substantially having a uniform thickness;

a load device formed in said continuous amorphous silicon layer and made of $n^-$ amorphous silicon;

a supply line electrically connected to said load device, for applying a supply voltage to said load device;

an output line electrically connected to said supply line through said load device, for outputting logic level voltages;

a first driver transistor having a gate electrode, a source region, a drain region, and a channel region, said source, drain, and channel regions being formed in said continuous amorphous silicon layer, for being switched based on a voltage applied to said gate electrode, said source regions of said first driver transistor being connected to said output line; and a ground line electrically connected to said output line through said first driver transistor, for applying a ground voltage to said first driver transistor, wherein said $n^-$ amorphous silicon is doped with an n-type impurity at a lower concentration than that of said source and drain regions.

3. A thin-film transistor circuit according to claim 2, further comprising a second driver transistor having a gate electrode, a source region, a drain region, and a channel region, said source, drain, and channel regions being formed in said continuous amorphous silicon layer, said second driver transistor being connected to said first driver transistor in parallel.

4. A thin-film transistor circuit according to claim 2, further comprising a second driver transistor having a gate electrode, a source region, a drain region, and a channel region, said source, drain, and channel regions being formed in said continuous amorphous silicon layer, said second driver transistor being connected to said first driver transistor in series between said output line and said ground line, and said output line being connected to said ground line through said first and second driver transistors.

5. A thin-film transistor circuit for a logic gate circuit, comprising:

a continuous amorphous silicon layer substantially having a uniform thickness;

a load device formed in said continuous amorphous silicon layer and made of $n^-$ amorphous silicon;

a first driver transistor having a gate electrode, a source region, a drain region, and channel region, said source, drain, and channel regions being formed in said continuous amorphous silicon layer, said source region being adjacent to said load device and being in direct contact with said load device, said first driver transistor turning on based on a voltage applied to said gate electrode of said first driver transistor;

a supply line electrically connected to said load device, for applying a supply voltage to said load device;

a ground line electrically connected to said drain regions of said first driver transistor, for applying a ground voltage to said first driver transistor; and an output line electrically connected to said source region, for providing logic level voltages based on the operation of said first driver transistor, wherein said $n^-$ amorphous silicon is doped with an n-type impurity at a lower concentration than that of said source and drain regions.

6. A thin-film transistor circuit according to claim 5, further comprising a second driver transistor having a gate electrode, a source region, a drain region, and a channel region, said source, drain, and channel regions being formed in said continuous amorphous silicon layer, said source region and said drain region of said second driver transistor being electrically connected to said output line and said ground line, respectively, so that said first and second driver transistors are connected with each other in parallel and that said output line provides said logic level voltages based on the operation of either said first driver transistor or said second driver transistor.

7. A thin-film transistor circuit according to claim 5 further comprising a second driver transistor having a gate electrode, a source region, a drain region, and a channel region, said source, drain, and channel regions being formed in said continuous amorphous silicon layer, said source and drain regions of said second driver transistor being electrically connected to said drain region of said first driver transistor and said ground line, respectively, so that said first and second driver transistors are connected with each other in series and that said output line provides said logic level voltages based on the operations of both said first and second driver transistors.

8. A thin-film transistor circuit for a logic gate circuit according to claim 5, wherein said n⁻ amorphous silicon has a sheet resistance in the range of $10^7$ ohm per square to $10^{10}$ ohm per square.

9. A thin-film transistor circuit for a logic gate circuit, comprising:

a continuous amorphous silicon layer including a region made of n⁻ amorphous silicon and a channel region of undoped amorphous silicon, said continuous amorphous silicon layer substantially having a uniform thickness;

a driver transistor having a source region, a drain region, a channel region, and a gate electrode, said source and drain regions being formed in said continuous amorphous silicon layer adjacent to said channel region; and a load device formed in said amorphous layer, said load device corresponding to a portion of a region other than said source, drain, and channel regions and directly connected to said source region of said driver transistor, wherein said n⁻ amorphous silicon is doped with an n-type impurity at a lower concentration than that of said source and drain regions.

10. A thin-film transistor circuit for a logic gate circuit according to claim 9, wherein said n⁻ amorphous silicon has a sheet resistance in the range of $10^7$ ohm per square to $10^{10}$ ohm per square.

* * * * *